(12) United States Patent
Roth et al.

(10) Patent No.: US 7,382,033 B2
(45) Date of Patent: Jun. 3, 2008

(54) LUMINESCENT BODY AND OPTICAL DEVICE INCLUDING THE SAME

(75) Inventors: Gundula Roth, c/o Dorfstrae 13a, D-17498 Levenhagen (DE); Walter Tews, Fleischmannstrasse, D-17489 Greifswald (DE)

(73) Assignees: Toyoda Gosei Co., Ltd., Nishikasugai-gun, Aichi (JP); Gundula Roth, Levenhagen (DE); Walter Tews, Greifswald (DE)

( * ) Notice: Subject to any disclaimer, the term of this patent is extended or adjusted under 35 U.S.C. 154(b) by 275 days.

(21) Appl. No.: 10/539,267

(22) PCT Filed: Dec. 19, 2003

(86) PCT No.: PCT/JP03/16379

§ 371 (c)(1),
(2), (4) Date: Aug. 29, 2005

(87) PCT Pub. No.: WO2004/056939

PCT Pub. Date: Jul. 8, 2004

(65) Prior Publication Data

US 2006/0163683 A1    Jul. 27, 2006

(30) Foreign Application Priority Data

Dec. 20, 2002 (DE) ................................. 102 59 945

(51) Int. Cl.
*H01L 31/0232* (2006.01)

(52) U.S. Cl. ...................... 257/432; 257/433; 257/414

(58) Field of Classification Search ................ 257/432, 257/414, 433
See application file for complete search history.

(56) References Cited

U.S. PATENT DOCUMENTS

| | | | | |
|---|---|---|---|---|
| 5,003,181 A | * | 3/1991 | Morlotti | 250/484.4 |
| 5,951,915 A | | 9/1999 | Hase et al. | |
| 6,509,651 B1 | * | 1/2003 | Matsubara et al. | 257/461 |
| 6,717,349 B2 | * | 4/2004 | Wang et al. | 313/483 |
| 2002/0063301 A1 | | 5/2002 | Hanamoto et al. | |
| 2002/0180338 A1 | | 12/2002 | Wang et al. | |

(Continued)

FOREIGN PATENT DOCUMENTS

EP    1 264 873 A2    12/2002

(Continued)

OTHER PUBLICATIONS

Japanese Notice of Rejection Reasons dated Jul. 4, 2006 with English Translation.

(Continued)

*Primary Examiner*—Kevin M. Picardat
*Assistant Examiner*—Neil Prasad
(74) *Attorney, Agent, or Firm*—McGinn IP Law Group, PLLC

(57) ABSTRACT

A luminous body of prolonged fluorescence lifetime characterized by comprising not only an activator but also at least one coactivator selected from the group consisting of La, Ce, Pr, Nd, Sm, Gd, Tb, Dy, Ho, Er, Tm, Yb, Lu, Bi, Sn, Sb and analogues thereof as a further luminescent center for enhancing the thermostability of luminous body. This luminous body excels in thermostability and fluorescence lifetime, so that it is useful as a luminous body for LED.

17 Claims, 9 Drawing Sheets

U.S. PATENT DOCUMENTS

2005/0001225 A1* 1/2005 Yoshimura et al. ............ 257/98
2006/0261308 A1* 11/2006 Hamamatsu et al. .. 252/301.4 F

FOREIGN PATENT DOCUMENTS

| | | |
|---|---|---|
| JP | 9-194833 | 7/1997 |
| JP | 10-112557 | 4/1998 |
| JP | 2002-171000 | 6/2002 |
| JP | 2002-363554 | 12/2002 |
| JP | 2002-363555 | 12/2002 |
| JP | 2004-501512 | 1/2004 |
| KR | 1999-0081843 | 11/1999 |
| KR | 2000-0029696 | 5/2000 |
| WO | WO 97/27267 | 7/1997 |
| WO | WO97/27267 | 7/1997 |
| WO | WO 01/89001 A2 | 11/2001 |

OTHER PUBLICATIONS

Korean Office Action dated Sep. 22, 2006, (with English translation).

Japanese Notification of Reasons for Refusal dated Feb. 7, 2007 with English Translation.

* cited by examiner

LUMINESCENT BODY AND OPTICAL DEVICE INCLUDING THE SAME

This application is based on German Patent Application No. (DE10259945.9), the entire disclosures of which are incorporated herein by reference.

TECHNICAL FIELD

The invention relates to a luminous body (or phosphor) having a prolonged fluorescence lifetime and an optical device using the same, for example, a luminous body for use in the manufacture of an optoelectronic solid constituent element and a compact energy saving lamp, and an optical device using the same.

BACKGROUND ART

Butler, K. H.: "Fluorescent Lamp Phosphors in Technology and Theory", University of Pennsylvania, Press University Park (1980) discloses luminous bodies for fluorescent lamps which can be excited in both blue and short wavelength ultraviolet spectrum regions and emit light in a visible spectrum region. However, what has been known about these luminous bodies up to now is that they can be used only in fluorescent lamps and compact energy saving lamps.

Both organic dyes and inorganic dyes are used in LEDs. However, organic dyes, when used alone, are low in stability and are low in effectiveness.

WO 98/12757, WO 02/93116, and U.S. Pat. No. 6,252,254 disclose inorganic materials which will be more and more used as a color converting material for producing white light. They, however, should cope with a YAG luminous body system composed mainly of yttrium aluminum garnet. This luminous body species is disadvantageous in that the white light produced is on a low color rendering level, and, for example, in the case of a combination of a blue LED with this yellow light luminous body, color rendering index Ra is 70 to 77 which belongs to color rendering species IIa. Unsatisfactory quality of the produced white light is attributable to an elliptical light distribution which can provide only unsatisfactory white light even when a color temperature below 5000 K is provided. The use of the YAG luminous body system, however, is limited to use in blue LED. For a color wavelength of less than 460 nm, the excitation of the YAG luminous body system is dramatically decreased. In a color wavelength range of 370 to 400 nm in which UVLED is operated, the YAG luminous body system can be excited only to a limited extent.

WO 00/33389 describes a $Ba_2SiO_4:Eu^{2+}$ luminous body system which has also good properties with stimulation in a color wavelength of less than 500 nm and exhibits maximum emission at a color wavelength of 505 nm.

WO 00/33390 discloses a luminous body mixture for LED which provides a color temperature of 3000 to 6500 K with a simultaneous color rendering index Ra of 83 to 87. Preferably, this luminous body, when used in combination with a further luminous body capable of emitting light in a red spectrum region or a blue spectrum region, can be used as a mixture for producing colored light and/or white light. All the conventional luminous bodies used in LEDs are disadvantageously unsatisfactory in temperature characteristics, as well as in thermostability. Due to these drawbacks, during the operation of LED, the effectiveness of the luminous body significantly decreases with increasing the temperature. As with the case of the YAG luminous body system, this causes a shift in energy distribution of light emission which causes a light color change.

For some of applications, conventional luminous bodies used in LEDs, for example, a Ce-activated YAG luminous body composed of barium magnesium aluminate and an Eu-activated BAM luminous body, have an additional drawback of a short fluorescence lifetime. The fluorescence lifetime of main conventional luminous bodies, that is, the Ce-activated luminous body and the Eu-activated luminous body, is typically a few microseconds. In some cases, the maximum fluorescence lifetime is a few milliseconds. This can be achieved, for example, by additional doping of manganese.

It is an object of the invention to provide a luminous body (or phosphor) that has an improved thermostability and a prolonged fluorescence lifetime associated therewith.

It is another object of the invention to provide an optical device that possesses excellent properties such as high light quality, good power saving, and high brightness.

DISCLOSURE OF THE INVENTION (A) According to one aspect of the invention, there is provided a luminous body with a prolonged fluorescence lifetime, characterized by comprising an activator and further at least one coactivator selected from the group consisting of lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), lutetium (Lu), bismuth (Bi), tin (Sn), antimony (Sb) and analogues thereof as an additional luminescent center for enhancing the thermostability of luminous body.

(B) According to another aspect of the invention, there is provided an optical device comprising a wavelength converting part comprising a luminous body which emits light upon excitation based on light emitted from an LED element, characterized in that said wavelength converting part comprises a luminous body comprising an activator and further at least one coactivator selected from the group consisting of lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), lutetium (Lu), bismuth (Bi), tin (Sn), antimony (Sb) and analogues thereof as an additional luminescent center for enhancing the thermostability.

(C) According to still another aspect of the invention, there is provided an optical device characterized by comprising
an LED element,
a power feeding part for mounting said LED element thereon and feeding power to said LED element,
a light transparent sealing part for sealing said LED element and said power feeding part integrally with each other, and
a wavelength converting part for emitting light upon excitation based on light emitted from said LED element, said wavelength converting part comprising a luminous body comprising an activator and further at least one coactivator selected from the group consisting of lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), lutetium (Lu), bismuth (Bi), tin (Sn), antimony (Sb) and analogues thereof as an additional luminescent center for enhancing the thermostability.

(D) According to a further aspect of the invention, there is provided
an optical device characterized by comprising
an LED lamp,
a light guiding part for guiding light emitted from said LED lamp,
a wavelength converting part for emitting light upon excitation based on light guided through said light guiding part, said wavelength converting part comprising a luminous body comprising an activator and further at least one coactivator selected from the group consisting of lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), lutetium (Lu), bismuth (Bi), tin (Sn), antimony (Sb) and analogues thereof as an additional luminescent center for enhancing the thermostability, and
a lighting part for lighting based on light emitting through said wavelength converting part.

BEST MODE FOR CARRYING OUT THE INVENTION

Figure 1:
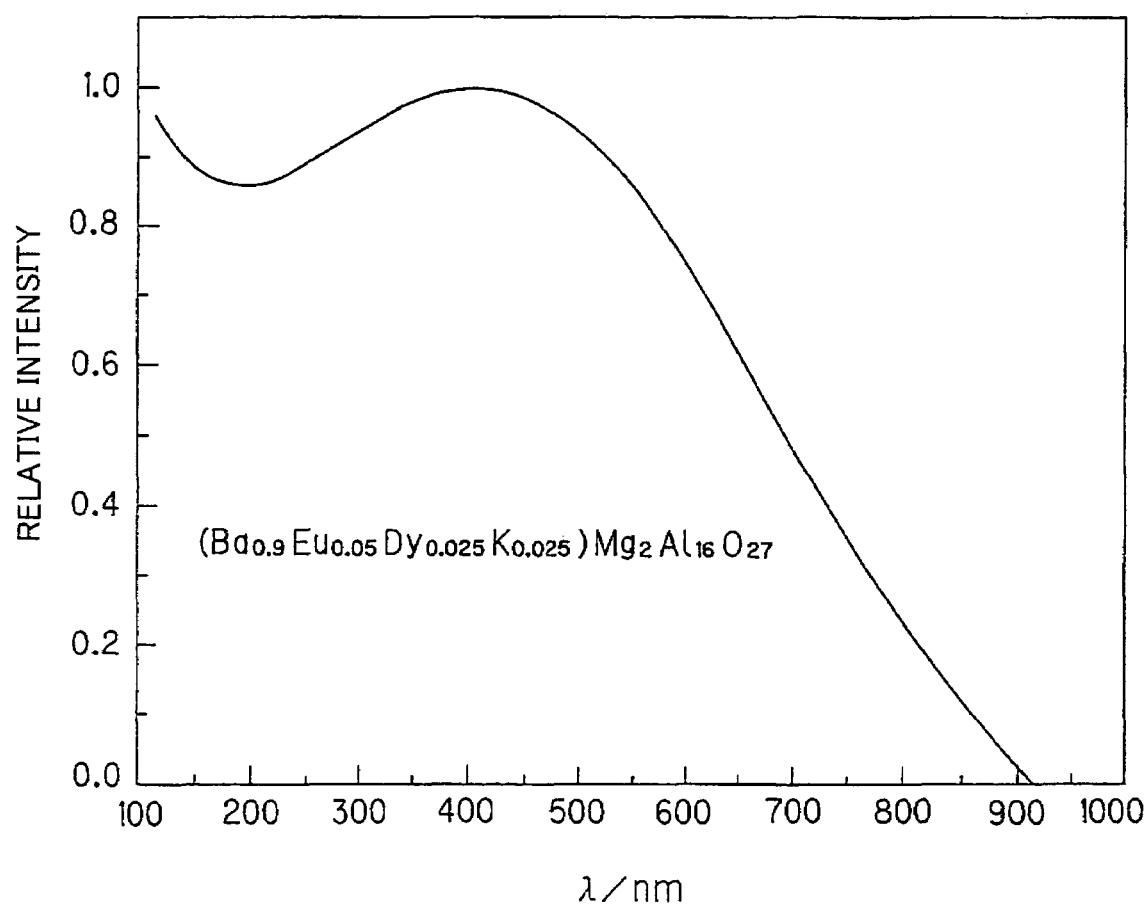
FIG. 1 is a characteristic diagram showing the relationship between relative intensity and heating temperature for the luminous body according to the invention.

The luminous body according to the invention will be explained in more detail in conjunction with the accompanying drawings and the like.

Some of luminous bodies according to the invention having a prolonged fluorescence lifetime, together with their relative light emission density at varied temperatures, will be shown in Table 1.

TABLE 1

| Composition of luminous body | Relative light emission density | | | |
|---|---|---|---|---|
| | 25° C. | 70° C. | 100° C. | 120° C. |
| $(Ba_{0.9648}Sr_{0.01}Eu_{0.025}Dy_{0.0002})_2(Si_{0.98}Ge_{0.02})_3O_{8.0006}$ | 100% | 100.6% | 102.7% | 101.5% |
| $(Ba_{0.9696}Sr_{0.015}Ca_{0.005}Eu_{0.01}Pr_{0.0004})_3(Si_{0.99}Ge_{0.01})O_{5.0018}$ | 100% | 102.4% | 102.8% | 102.0% |
| $(Ba_{0.965}Sr_{0.02}Zn_{0.005}Eu_{0.01})(Si_{0.97}Ge_{0.03})_2(Al_{0.002}Dy_{0.00003})O_{5.003045}$ | 100% | 101.4% | 102.0% | 101.5% |
| $(Ba_{0.905}Sr_{0.07}Zn_{0.005}Mg_{0.005}Eu_{0.015})_2Si(Al_{0.0001}Dy_{0.0002})O_{4.00045}$ | 100% | 101.2% | 102.4% | 102.3% |
| $(Ba_{0.915}Sr_{0.005}Zn_{0.005}Eu_{0.075})_3Mg_{0.99}Mn_{0.01}(Si_{0.998}Ge_{0.002})_2(Ga_{0.0001}Dy_{0.0001})O_{8.0003}$ | 100% | 102.0% | 103.6% | 102.4% |
| $(Ba_{0.92}Sr_{0.04}Zn_{0.01}Ca_{0.01}Eu_{0.02})_2Mg(Si_{0.9}Ge_{0.1})_2(Ga_{0.0001}Dy_{0.0002})O_{7.00045}$ | 100% | 100.6% | 101.0% | 100.8% |
| $(Ba_{0.8}K_{0.05}Dy_{0.05}Eu_{0.1})Mg_2Al_{16}O_{27}$ | 100% | 102.8% | 107.4% | 108.0% |
| $(Ba_{0.15}Sr_{0.8}Eu_{0.05})_4Al_{12.5}Ga_{1.49996}Dy_{0.00004}Si_{0.005}O_{25.0075}$ | 100% | 101.5% | 103.5% | 103.5% |
| $(Ba_{0.47}Sr_{0.5}Eu_{0.03})Al_{1.5997}Ga_{0.4}Dy_{0.0003}Si_{0.004}O_{4.006}$ | 100% | 100.5% | 100.8% | 100.6% |

(1) In Table 1 on line 1, a luminous body having a composition $(Ba_{0.9648}Sr_{0.01}Eu_{0.025}Dy_{0.0002})_2(Si_{0.98}Ge_{0.02})_3O_{8.0006}$ is described. Raw materials for this luminous body are $BaCO_3$, $SrCO_3$, $Eu_2O_3$, $Dy_2O_3$, $SiO_2$, and $GeO_2$.

Preparation:

The raw materials in an oxide form or the raw materials from materials convertible to oxides are stoichiometrically weighed as specified in the table and mixed together, and, depending upon reaction conditions, the mixture is fired in a corundum crucible in a reducing atmosphere of a nitrogen/hydrogen mixture at 1220° C. for 4 hr. The final product is washed with water, is dried, and is sieved. The luminous body compound thus obtained has a maximum light emission at a color wavelength of 487 nm and has a prolonged fluorescence lifetime.

(2) In Table 1 on line 2, a luminous body having a composition $(Ba_{0.9696}Sr_{0.015}Ca_{0.005}Eu_{0.01}Pr_{0.0004})_3(Si_{0.99}Ge_{0.01})O_{5.0018}$ is described. Raw materials for this, luminous body are $BaCO_3$, $SrCO_3$, $CaCO_3$, $Eu_2O_3$, $Pr_6O_{11}$, $SiO_2$, and $GeO_2$.

Preparation:

The raw materials are stoichiometrically weighed and vigorously mixed together for a few hours, and the mixture is then fired in a corundum crucible in a reducing atmosphere of a nitrogen/hydrogen mixture at 1245° C. for 3 hr. The fired cake is ground, is washed with water, is dried, and is sieved. The luminous body compound thus obtained has a maximum light emission at a color wavelength of 589 nm and has a prolonged fluorescence lifetime.

(3) In Table 1 on line 3, a luminous body having a composition $(Ba_{0.965}Sr_{0.02}Zn_{0.005}Eu_{0.01})(Si_{0.97}Ge_{0.03})_2(Al_{0.002}Dy_{0.00003})O_{5.003045}$ is described. Raw materials for this luminous body are $BaCO_3$, $SrCO_3$, $ZnO$, $Eu_2O_3$, $SiO_2$, $GeO_2$, $Al_2O_3$ and $Dy_2O_3$.

Preparation:

The raw materials are stoichiometrically weighed and mixed together homogeneously for a few hours, and the mixture is placed in an oven at room temperature and is fired in a reducing atmosphere of a nitrogen/hydrogen mixture at 1220° C. for 4 hr. The fired product is ground, is washed with water, is dried, and is sieved. The luminous body compound thus obtained has a maximum light emission at a color wavelength of 509 nm and has a prolonged fluorescence lifetime.

(4) In Table 1 on line 4, a luminous body having a composition $(Ba_{0.0905}Sr_{0.07}Zn_{0.005}Mg_{0.005}Eu_{0.015})_2Si(Al_{0.0001}Dy_{0.0002})O_{4.00045}$ is described. Raw materials for this luminous body are $BaCO_3$, $SrCO_3$, ZnO, $Eu_2O_3$, MgO, $SiO_2$, $Dy_2O_3$, and $Al_2O_3$.

Preparation:

The indicated raw materials are mixed together at the above stoichiometrical ratio. The mixture is prefired under reducing conditions at a temperature of 1220° C. The prefired product is ground and is then subjected to a secondary firing process in a reducing atmosphere of a nitrogen/hydrogen mixture at 1220° C. The secondary firing for 2 hr provides a homogeneous final product. Thereafter, the final product is washed with water, is dried, and is sieved. The luminous body compound thus obtained has a maximum light emission at a color wavelength of 445 nm and has a prolonged fluorescence lifetime.

(5) In Table 1 on line 5, a luminous body having a composition $(Ba_{0.915}Sr_{0.005}Zn_{0.005}Eu_{0.075})_3Mg_{0.99}Mn_{0.01}(Si_{0.998}Ge_{0.002})_2(Ga_{0.0001}Dy_{0.0001})O_{8.0003}$ is described. Raw materials for this luminous body are $BaCO_3$, $SrCO_3$, ZnO, $Eu_2O_3$, MgO, $MnCO_3$, $SiO_2$, $GeO_2$, $Dy_2O_3$, and $Ga_2O_3$.

Preparation:

The raw materials are satisfactorily mixed, and the mixture is then subjected to a firing process. The firing process is carried out under reaction conditions in a reducing atmosphere of a nitrogen/hydrogen mixture at 1225° C. for 3 hr. The final product is ground, is washed with water, is dried, and is sieved. The luminous body compound thus obtained has a maximum light emission at a color wavelength of 543 nm and has a prolonged fluorescence lifetime.

(6) In Table 1 on line 6, a luminous body having a composition $(Ba_{0.92}Sr_{0.04}Zn_{0.01}Ca_{0.01}Eu_{0.02})_2Mg(Si_{0.9}Ge_{0.1})_2(Ga_{0.0001}Dy_{0.0002})O_{7.00045}$ is described. Raw materials for this luminous body are $BaCO_3$, $SrCO_3$, ZnO, $CaCO_3$, $Eu_2O_3$, MgO, $SiO_2$, $GeO_2$, $Dy_2O_3$, and $Ga_2O_3$.

Preparation:

The raw materials are stoichiometrically weighed and are mixed together thoroughly and vigorously, and the mixture is then subjected to a firing process in a reducing atmosphere of a nitrogen/hydrogen mixture at 1235° C. for 4 hr. The final product is ground, is washed with water, is dried, and is sieved. The luminous body compound thus obtained has a maximum light emission at a color wavelength of 548 nm and has a prolonged fluorescence lifetime.

(7) In Table 1 on line 7, a luminous body having a composition $(Ba_{0.8}K_{0.05}Dy_{0.05}Eu_{0.1})Mg_2Al_{16}O_{27}$ is described. Raw materials for this luminous body are $BaCO_3$, $K_2CO_3$, $Dy_2O_3$, $Eu_2O_3$, MgO, and $Al_2O_3$.

Preparation:

The raw materials are stoichiometrically weighed, and $AlF_3$ is then added as a fluxing agent, and the mixture is fired in a reducing atmosphere of a nitrogen/hydrogen mixture at 1420° C. for 2 hr. The fired product thus obtained is ground, is washed several times with water, is dried, and is sieved. The luminous body compound thus obtained has a maximum light emission at a color wavelength of 452 nm and has a prolonged fluorescence lifetime.

The relationship between the relative light emission intensity (relative intensity) and the heating temperature in the range of 100 K to 900 K for the luminous body $(Ba_{0.8}K_{0.05}Dy_{0.05}Eu_{0.1})Mg_2Al_{16}O_{27}$ is shown in FIG. 1. The relative intensity of the luminous body is more than 0.8 in the temperature range of 200 K to about 600 K.

(8) In Table 1 on line 8, a luminous body having a composition $(Ba_{0.15}Sr_{0.8}Eu_{0.05})_4Al_{12.5}Ga_{1.49996}Dy_{0.00004}Si_{0.005}O_{25.0075}$ is described. Raw materials for this luminous body are $BaCO_3$, $SrCO_3$, $Eu_2O_3$, $Al_2O_3$, $Ga_2O_3$, $SiO_2$, and $Dy_2O_3$.

Preparation:

The indicated raw materials are stoichiometrically weighed, and boric acid is then added as a fluxing agent, followed by mixing to prepare a homogeneous mixture. The mixture is fired in a corundum crucible in a reducing atmosphere of a nitrogen/hydrogen mixture at 1420° C. for 2 hr. Subsequently, the fired product thus obtained is ground, is again mixed vigorously, and is further subjected to a firing process under the same conditions. Next, the final product thus obtained is ground, is washed with water, is dried, and is sieved. The luminous body compound thus obtained has a maximum light emission at a color wavelength of 496 nm and has a prolonged fluorescence lifetime.

(9) In Table 1 on line 9, a luminous body having a composition $(Ba_{0.47}Sr_{0.5}Eu_{0.03})Al_{1.5997}Ga_{0.4}Dy_{0.0003}Si_{0.004}O_{4.006}$ is described. Raw materials for this luminous body are $BaCO_3$, $SrCO_3$, $Eu_2O_3$, $Al_2O_3$, $Ga_2O_3$, $SiO_2$, and $Dy_2O_3$.

Preparation:

The raw materials are stoichiometrically weighed and are mixed with boric acid and ammonium chloride as a fluxing agent, and the mixture is fired in a reducing atmosphere of a nitrogen/hydrogen mixture at 1420° C. for 2 hr. The fired cake is ground and is mixed, and the firing process is then repeated. The final product thus obtained is ground, is washed with water, is dried, and is sieved. The compound thus obtained has a maximum light emission at a color wavelength of 523 nm and has a prolonged fluorescence lifetime.

Figure 2:
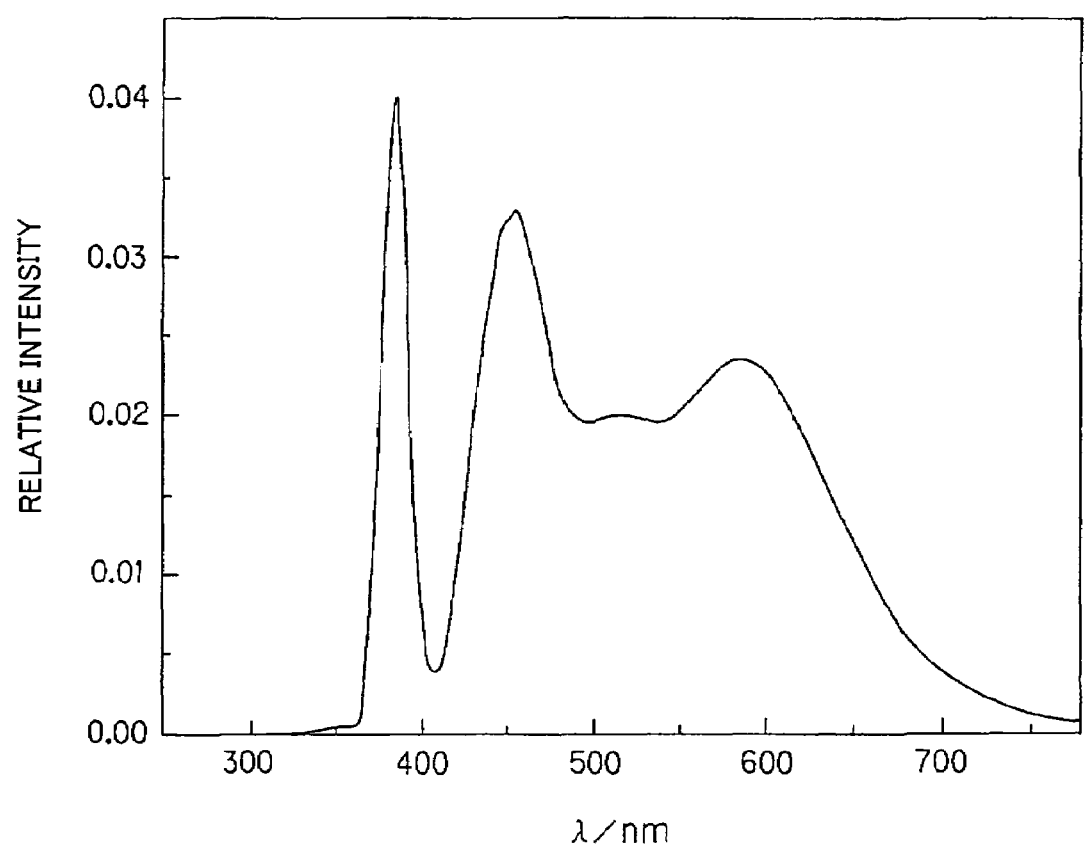
FIG. 2 is a characteristic diagram showing the relationship between relative intensity and light emission spectrum for the luminous body according to the invention.

FIG. 2 shows a light emission spectrum of a rainbow color emitted from a light source 1 (not shown). The light source 1 contains a mixture of the following luminous bodies:

$(Ba_{0.8}K_{0.05}Dy_{0.05}Eu_{0.01})Mg_2Al_{16}O_{27}$;

$(Ba_{0.965}Sr_{0.02}Zn_{0.005}Eu_{0.01})(Si_{0.97}Ge_{0.03})_2(Al_{0.002}Dy_{0.00003})O_{5.003045}$; and $(Ba_{0.9696}Sr_{0.015}Ca_{0.005}Eu_{0.01}Pr_{0.0004})_3(Si_{0.99}Ge_{0.01})O_{5.0018}$.

The relative light emission intensity (relative intensity) of color at an ultraviolet wavelength of 380 nm is 0.04, the relative light emission intensity of blue at a wavelength of 490 nm is 0.034, the relative light emission intensity of green at a wavelength of 508 nm is 0.02, the relative light emission intensity of yellow at a wavelength of 560 nm is 0.024, and the relative light emission intensity of red at a wavelength of 610 nm is 0.02.

Figure 3:
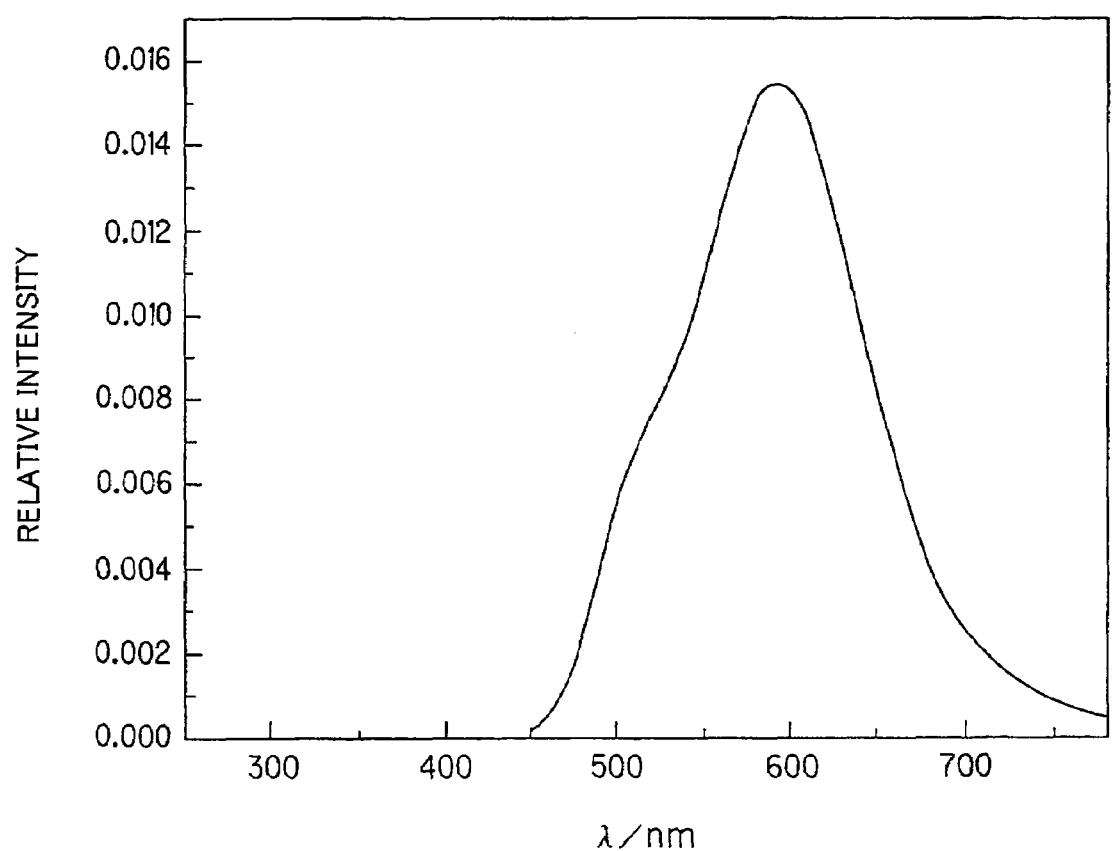
FIG. 3 is a characteristic diagram showing relative intensity in a light source in such a state that excitation energy has been switched off.

Even after the excitation energy in the light source 1 is switched off, this light source still emits yellow light at a relative light emission intensity (relative intensity) of 0.0375 with a maximum luminous color wavelength of 580 nm shown in FIG. 3.

Effect of Luminous Body According to Invention (1) According to the luminous body of the invention, in addition to the conventional activator, at least one coactivator selected from the group consisting of lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), lutetium (Lu), bismuth (Bi), tin (Sn), antimony (Sb)

and analogues thereof is used. The coactivator provides a further center in the luminous body. In the case of LED, a lower energy loss process caused in the luminous body per se at a higher measurement operating temperature can be realized. The incorporation of the above contemplated additional coactivator in the luminous body can result in the formation of further and/or new recombination center.

The additional activation is advantageous in that the fluorescence lifetime can be increased to a few seconds or a few minutes or up to a few hours. This makes it possible for light sources, which are becoming more and more important especially in applications where work is performed under safe light and health light conditions, to be compatible with the behavior of the human's eye.

The mixture of these luminous bodies is suitable for realizing various fluorescence lifetimes. According to the invention, by virtue of this, the color of light emitted from LED can be changed upon switching-off of the excitation of the luminous body.

The further and new center have an additional advantage that electrons are mainly captured from the excited state by virtue of these centers which, as a general rule, can cause radiation recombination with luminous ions. Next, these electrons are not trapped by killer centers, that is, centers where excitation energy is wastefully converted to heat resulting in light emission loss.

(2) According to the invention, there is provided a luminous body which comprises silicate-germanate and is improved in thermostability and fluorescence lifetime by doping with europium, wherein said luminous body further comprises an additional dopant and corresponds to the empirical formula:

$$M'_a M''_b (Si_{1-z}Ge)_c (Al,Ga,In)_d (Sb,V,Nb,Ta)_e O_{(a+b+2c+3d/2+5e/2-n/2)} X_n : Eu_x, R_y$$

wherein

M' represents one or more elements selected from the group consisting of calcium (Ca), strontium (Sr), barium (Ba), and zinc (Zn);

M" represents one or more elements selected from the group consisting of magnesium (Mg), cadmium (Cd), manganese (Mn), and beryllium (Be);

R represents one or more elements selected from the group consisting of La, Ce, Pr, Nd, Sm, Gd, Tb, Dy, Ho, Er, Tm, Yb, Lu, Bi, Sn, and Sb;

X represents an ion selected from the group consisting of fluorine (F), chlorine (Cl), and bromine (Br) to balance the charge;

and $0.5 \leq a \leq 8$, $0 \leq b \leq 5$, $0 < c \leq 10$, $0 \leq d \leq 2$, $0 \leq e \leq 2$, $0 \leq n \leq 4$, $0 \leq x \leq 0.5$, $0 \leq y \leq 0.5$, and $0 \leq z \leq 1$.

(3) The improvement in thermostability and fluorescence lifetime in the luminous body comprising aluminate-gallate and doped with europium can be achieved by the luminous body that comprises an additional dopant and corresponds to the empirical formula:

$$M'_4(Al,Ga)_{14}(Si,Ge)_p O_{25+2p} : Eu_x, R_y$$

or that comprises an additional dopant and corresponds to the empirical formula:

$$M'(Al,Ga)_2(Si,Ge)_p O_{4+2p} : Eu_x, R_y$$

wherein

M' represents one or more elements selected from the group consisting of Sr, Ba, Ca, Mg, and Zn;

R represents one or more elements selected from the group consisting of La, Ce, Pr, Nd, Sm, Gd, Tb, Dy, Ho, Er, Tm, Yb, Lu, Bi, Sn, and Sb;

and $0 < p \leq 1$, $0 \leq x \leq 0.5$, and $0 \leq y \leq 0.5$.

(4) The improvement in thermostability and fluorescence lifetime in the luminous body comprising aluminate and doped with europium can be achieved by the luminous body that comprises an additional dopant and corresponds to the empirical formula:

$$(M',M'',M''')M''''_2 Al_{16} O_{27} : Eu_x, R_y$$

wherein

M' represents one or more elements selected from the group consisting of Ba, Sr, and Ca;

M" represents one or more elements selected from the group consisting of lithium (Li), sodium (Na), potassium (K), and rubidium (Rb);

M''' represents Dy;

M'''' represents Mg or Mn;

R represents one or more elements selected from the group consisting of La, Ce, Pr, Nd, Sm, Gd, Tb, Ho, Er, Tm, Yb, Lu, Bi, Sn, and Sb; and $0 < x \leq 0.5$, and $0 \leq y \leq 0.5$.

(5) In order to improve thermostability and fluorescence lifetime in the luminous body comprising alkaline earth metal aluminate-gallate and being doped with europium, doping with an additional dopant corresponding to the following empirical formula is carried out:

$$M'_{1-a}(Al,Ga)_b(Si,Ge)_c O_{1.5b+1+3c/2} : Eu_x, R_y$$

wherein

M' represents one or more elements selected from the group consisting of Ca, Sr, Ba, and Mg;

R represents one or more elements selected from the group consisting of La, Ce, Pr, Nd, Sm, Gd, Tb, Dy, Ho, Er, Tm, Yb, Lu, Bi, Sn, and Sb; and $0 \leq a \leq 1$, $0 \leq b \leq 10$, $0 \leq c \leq 8$, $0 \leq x \leq 0.5$, and $0 \leq y \leq 0.5$.

According to the invention, these luminous bodies, for example, $(Ba_{0.9648}Sr_{0.01}Eu_{0.025}Dy_{0.0002})_2(Si_{0.98}Ge_{0.02})_3 O_{8.0006}$, $(Ba_{0.9696}Sr_{0.015}Ca_{0.005}Eu_{0.01}Pr_{0.0004})_3(Si_{0.99}Ge_{0.01}) O_{5.0018}$, $(Ba_{0.965}Sr_{0.02}Zn_{0.005}Eu_{0.01}) (Si_{0.97}Ge_{0.03})_2 (Al_{0.002}Dy_{0.00003})O_{5.003045}$, $(Ba_{0.905}Sr_{0.07}Zn_{0.005}Mg_{0.005}Eu_{0.015})_2 Si (Al_{0.0001}Dy_{0.0002})O_{4.00045}$, $(Ba_{0.915}Sr_{0.005}Zn_{0.005}Eu_{0.075})_3 Mg_{0.99}Mn_{0.01} (Si_{0.998}Ge_{0.002})_2(Ga_{0.0001}Dy_{0.0001})O_{8.0003}$, $(Ba_{0.92}Sr_{0.04}Zn_{0.01}Ca_{0.01}Eu_{0.02})_2 Mg(Si_{0.9}Ge_{0.1})_2 (Ga_{0.0001}Dy_{0.0002})O_{7.00045}$, $(Ba_{0.8}K_{0.05}Dy_{0.05}Eu_{0.01})Mg_2 Al_{16} O_{27}$, $(Ba_{0.15}Sr_{0.8}Eu_{0.05})_4 Al_{12.5} Ga_{1.49996} Dy_{0.00004}Si_{0.005}O_{25.0075}$, and $(Ba_{0.47}Sr_{0.5}Eu_{0.03})Al_{1.5997}Ga_{0.4}Dy_{0.0003}Si_{0.004}O_{4.006}$ are used in layers which produce lights ranging from colored lights to white light in LEDs or compact energy saving lamps.

(6) The luminous body mixture comprising a silicate-germanate luminous body according to the invention and/or the luminous body mixture comprising at least one aluminate-gallate luminous body according to the invention are also suitable as layers for improving thermostability and fluorescence lifetime in LEDs and compact energy saving lamps.

An additional advantage is that, upon the operation of LED, electrons become free from these centers by heat energy provided by the chip per se and, at the same time, light emission can take place. In any case, generated heat is effectively converted.

This contributes to an improvement in thermostability of the luminous body and thus can be advantageously used in luminous elements and is also advantageous for use in specific LEDs which produce colored light and/or white light. The operation of LED at a temperature of about 60 to 120° C. can improve effectiveness over the conventional luminous body. Further, the luminous body according to the invention has longer fluorescence lifetime than the conventional luminous body for LEDs which generally has a fluorescence lifetime on the order of microseconds. At the same time, by virtue of the above properties, the silicate-germanate luminous body is very suitable for light emission from a blue spectrum region so far as an orange-red spectrum region in a visible spectrum depends upon the composition. In particular, the silicate-germanate luminous body has a prolonged fluorescence lifetime and, at the same time, is selected for use as a converting material for a blue and/or ultraviolet excitation light source (wavelength 300 to 500 nm) to provide white light having a high level of effectiveness.

A further advantage is that freeing of electrons from the centers enables an excited state other than the ordinarily existing excited state to be provided and, in some cases, upon the operation of the excitation source, the effectiveness increases with an increase in temperature.

This principle can be applied to luminous bodies which emit blue to red spectrum region.

At the same time, when the silicate-germanate luminous body is used alone or in combination with an aluminate-gallate luminous body or other luminous body, upon excitation by blue and/or ultraviolet LED, colored light or white light having a prolonged fluorescence lifetime can be provided. Both germanium in a silicate lattice and gallium in an aluminate lattice slightly cause lattice expansion. In both the cases, emitted light is slightly shifted, and this affects the fluorescence lifetime. The light thus obtained has significantly high fluorescence lifetime, high thermostability, and high light quality.

Optical devices using the above luminous bodies will be explained in detail.

First Embodiment

Figure 4:
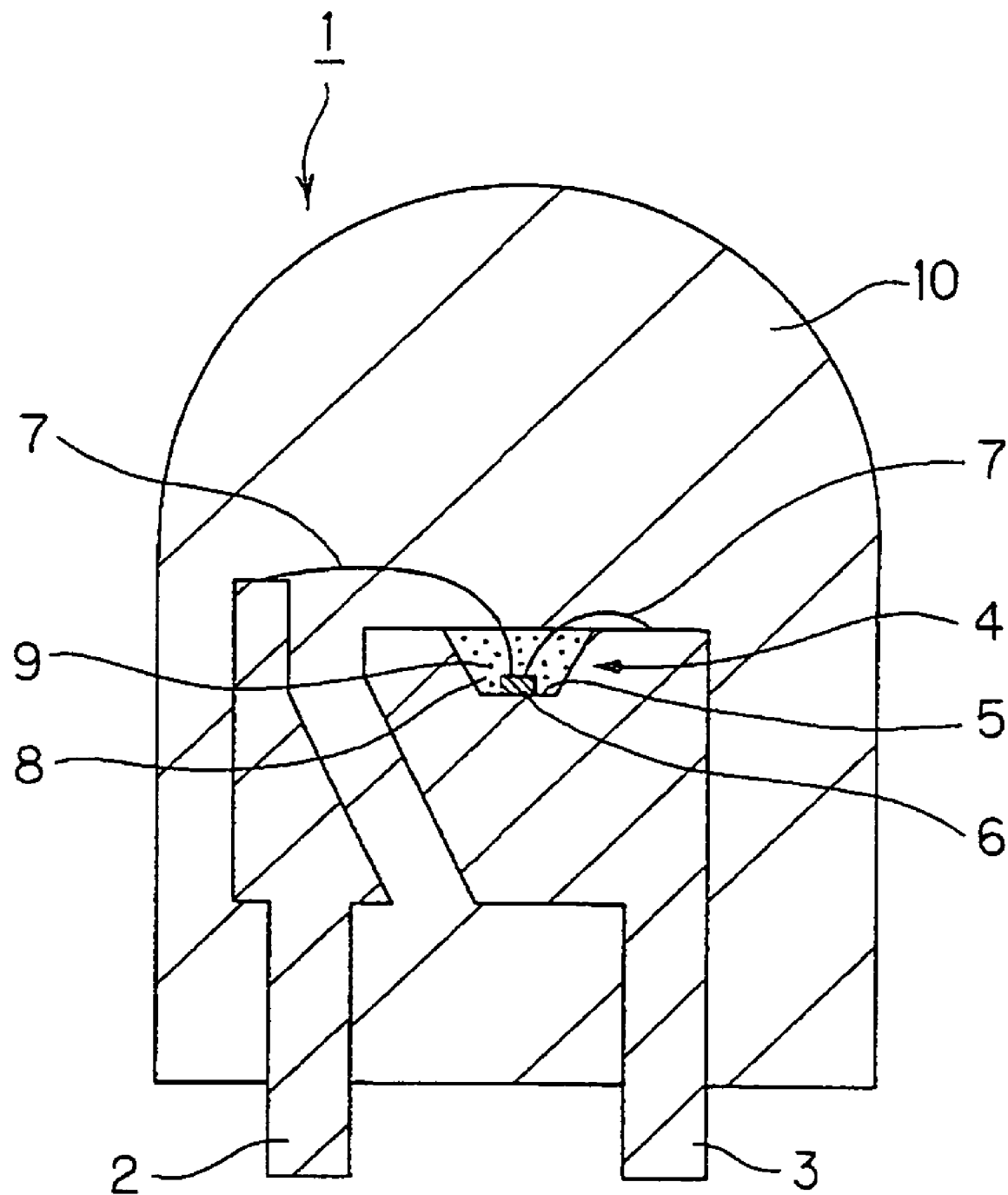
FIG. 4 is a cross-sectional view of a light emitting device in a first embodiment.

FIG. 4 is a cross-sectional view showing a light emitting device in the first embodiment of the invention.

This light emitting device 1 is a wavelength conversion-type light emitting device 1 comprising an LED element mounted on a lead. This device 1 includes leads 2 and 3 as wiring conductors. A cup part 4 for receiving an LED element is provided on the lead 2. An LED element 6 is bonded to the cup part 4 in its bottom part 5. The leads 2 and 3 are electrically connected to electrodes (not shown) of the EL element 6 through wires 7 of gold (Au). The cup part 4, together with the LED element 6 and the wire 7, is sealed with a light transparent sealing resin 8. A luminous body 9 is mixed in the sealing resin 8. The leads 2 and 3, the LED element 6, and the wires 7 are integrally sealed with a light transparent and shell-shaped sealing resin 10.

The leads 2 and 3 are formed of copper or a copper alloy having excellent thermal conductivity and electrical conductivity. The cup part 4 provided on the lead 3 has an inclined inner wall formed by enlarging the size of the inner wall toward the light emitting side from the viewpoint of enhancing light emission toward the outside of the cup.

The LED element 6 is a GaN based LED element that emits blue light with wavelength 460 nm. The LED element 6 is bonded and fixed onto the cup part 4 in its bottom 5 with the aid of a light reflective adhesive.

The sealing resin 8 is a silicone resin mixed with the luminous body 9 and has been potted in the cup part 4 for sealing of the LED element 6.

In the luminous body 9, in addition to the conventional activator, at least one coactivator selected from the group consisting of lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), lutetium (Lu), bismuth (Bi), tin (Sn), antimony (Sb) and analogues thereof is used.

Specifically, the sealing resin 8 has been mixed with a luminous body 9 comprising silicate-germanate and doped with europium, wherein the luminous body 9 further comprises an additional dopant and corresponds to the empirical formula:

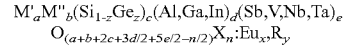

$$M'_a M''_b (Si_{1-z}Ge_z)_c (Al,Ga,In)_d (Sb,V,Nb,Ta)_e$$
$$O_{(a+b+2c+3d/2+5e/2-n/2)} X_n : Eu_x, R_y$$

wherein

M' represents one or more elements selected from the group consisting of calcium (Ca), strontium (Sr), barium (Ba), and zinc (Zn);

M" represents one or more elements selected from the group consisting of magnesium (Mg), cadmium (Cd), manganese (Mn), and beryllium (Be);

R represents one or more elements selected from the group consisting of La, Ce, Pr, Nd, Sm, Gd, Tb, Dy, Ho, Er, Tm, Yb, Lu, Bi, Sn, and Sb;

X represents an ion selected from the group consisting of fluorine (F), chlorine (Cl), and bromine (Br) to balance the charge;

and $0.5 \leq a \leq 8$, $0 \leq b \leq 5$, $0 < c \leq 10$, $0 \leq d \leq 2$, $0 \leq e \leq 2$, $0 \leq n \leq 4$, $0 \leq x \leq 0.5$, $0 \leq y \leq 0.5$, and $0 \leq z \leq 1$.

The sealing resin 10 is an epoxy resin and has a hemispherical optical shape on the light emission side formed by casting molding using a mold for forming a shell shape.

Figure 5:
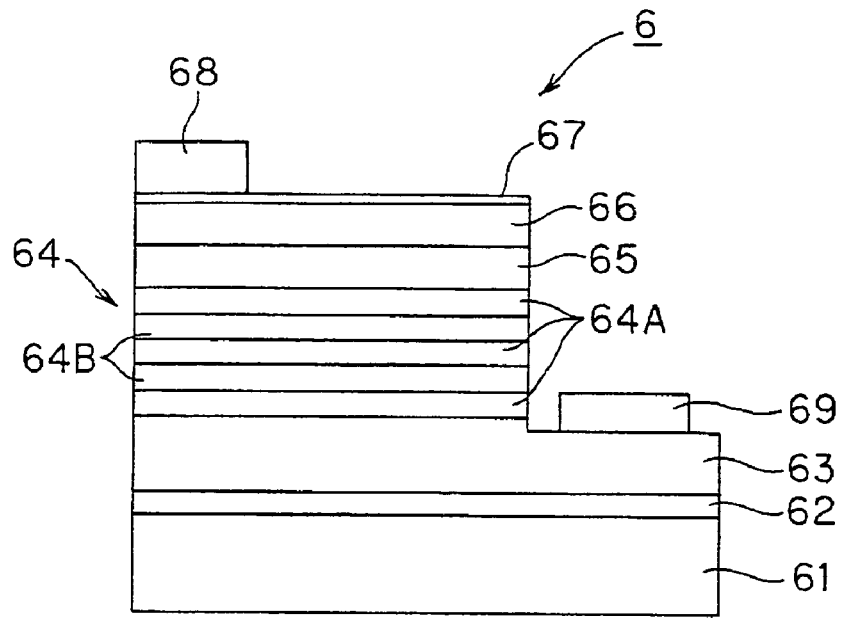
FIG. 5 is a diagram showing the layer construction of an LED element in a first embodiment.

FIG. 5 is a diagram showing the layer construction of the LED element 6. The LED element 6 includes a sapphire substrate 61. An AlN buffer layer 62 is provided on the sapphire substrate 61. An Si-doped n-type GaN cladding layer (a contact layer) 63 is provided on the AlN buffer layer 62. MQW 64 is provided on the n-type GaN cladding layer 63. MQW 64 comprises, provided on the n-type GaN cladding layer 63, three InGaN well layers 64A alternating with two GaN barrier layers 64B. An Mg-doped p-type GaN cladding layer 65 is provided on MQW 64. An Mg-doped p-type GaN contact layer 66 is provided on the p-type GaN cladding layer 65. A transparent electrode 67 is provided on the p-type GaN contact layer 66. A pad electrode 68 is provided on the transparent electrode 67 at its predetermined position, for example, a position near the side face of the element. The LED element 6 further includes an n-side electrode 69 which is formed by removing a part of the p-type GaN contact layer 66, the p-type GaN cladding layer 65, MQW 64, and the n-type GaN cladding layer 63 by etching to expose the n-type GaN cladding layer 63 and forming the n-side electrode 69 on the exposed n-type GaN cladding layer 63. This LED element 6 has a double heterostructure having MQW 64 as a luminous layer, and Al may be properly incorporated in each layer.

Next, a process for manufacturing the light emitting device 1 will be explained.

At the outset, a copper plate for a lead frame is punched by pressing to form a lead frame with leads 2 and 3. The cup part 4 may be formed on the lead 3 in the formation of the lead frame. The LED element 6 is then bonded and fixed onto a position within the cup part 4 with the aid of an adhesive. Next, the pad electrode 68 in the LED element 6 is electrically connected to the lead 2 through the wire 7, and the n-side electrode 69 is electrically connected to the lead 3 through the wire 7. A silicone resin previously mixed with the luminous body 9 is then potted in the cup part 4 to seal the LED element 6. The leads 2 and 3 with the sealed LED element 6 are then placed in a resin molding mold. An epoxy resin is then poured into the mold to form a shell-shaped sealing resin 10 around the leads 2 and 3. The leads 2 and 3 are then cut from the lead frame.

The operation of the light emitting device 1 will be explained.

The leads 2 and 3 are connected to a power supply unit (not shown). Upon energization, light emission takes place in MQW 64 in the LED element 6. Light based on the light emission in MQW 64 is emitted to the outside of the LED element 6, whereby the luminous body 9 is irradiated with this light. The luminous body 9 is excited by the light emitted from the LED element 6 (hereinafter referred to as "emitted light") to emit excitation light. The emitted light and the excitation light are mixed together to produce white light within the cup part 4. This white light is emitted from the inside of the cup part 4 to the outside of the light emitting device through the sealing resin 10. A part of the white light is reflected from the inclined inner wall in the cup part 4 and is then emitted to the outside of the light emitting device 1 through the sealing resin 10.

The following effects can be attained by the light emitting device 1 in the first embodiment of the invention.

The cup part 4 is sealed with the sealing resin 8 mixed with the luminous body 9 comprising the conventional activator and the additional coactivator. This construction can improve the thermostability of the luminous body and can suppress the shift of light emission energy distribution to stabilize the color of light emitted from the LED element 6.

The addition of the coactivator can prolong the fluorescence lifetime to a few seconds or a few minutes or up to a few hours. Therefore, the light emitting device 1 is very suitable for use in applications where work is performed under safe light and health light conditions, to be compatible with the behavior of the human's eye.

The addition of the coactivator can realize various fluorescence lifetimes. Therefore, the color of light emitted from the light emitting device 1 can be changed upon switching-off of the excitation of the luminous body.

Further, the luminous body 9 may be used as a mixture with other luminous body. Other luminous bodies usable herein include, for example, YAG. In this case, when the light emitting device 1 is turned OFF, extinction takes place while causing a change in color of light from white to a reddish color. Specifically, a construction using a combination of a light emitting device comprising a blue LED element and YAG with the luminous body 9 and a construction using a combination of a light emitting device comprising an ultraviolet LED element and a luminous body excitable by ultraviolet light with the luminous body 9 may be adopted.

In the first embodiment, the construction in which the luminous body 9 comprising silicate-germanate and doped with europium and further comprising the above additional dopant is mixed in the sealing resin 8 has been explained. The following luminous body may be mixed as other luminous body 9: a luminous body 9 that comprises aluminate-gallate and doped with europium, wherein the luminous body body further comprises an additional dopant and corresponds to the empirical formula:

$$M'_4(Al,Ga)_{14}(Si,Ge)_pO_{25+2p}:Eu_x,R_y$$

or wherein the luminous body further comprises an additional dopant and corresponds to the empirical formula:

$$M'(Al,Ga)_2(Si,Ge)O_{4+2p}:Eu_x,R_y$$

wherein

M' represents one or more elements selected from the group consisting of Sr, Ba, Ca, Mg, and Zn;

R represents one or more elements selected from the group consisting of La, Ce, Pr, Nd, Sm, Gd, Tb, Dy, Ho, Er, Tm, Yb, Lu, Bi, Sn, and Sb;

and $0<p\leq 1$, $0\leq x\leq 0.5$, and $0\leq y\leq 0.5$.

Further, the following luminous body may be mixed as other luminous body 9: a luminous body 9 that comprises aluminate and doped with europium, wherein the luminous body further comprises an additional dopant and corresponds to the empirical formula:

$$(M',M'',M''')M''''_2Al_{16}O_{27}:Eu_x,R_y$$

wherein

M' represents one or more elements selected from the group consisting of Ba, Sr, and Ca;

M'' represents one or more elements selected from the group consisting of lithium (Li), sodium (Na), potassium (K), and rubidium (Rb);

M''' represents Dy;

M'''' represents Mg or Mn;

R represents one or more elements selected from the group consisting of La, Ce, Pr, Nd, Sm, Gd, Tb, Ho, Er, Tm, Yb, Lu, Bi, Sn, and Sb;

and $0<x\leq 0.5$, and $0\leq y\leq 0.5$.

Further, the following luminous body may be mixed as other luminous body 9: a luminous body 9 that comprises alkaline earth metal aluminate-gallate and doped with europium, wherein the luminous body further comprises an additional dopant and corresponds to the empirical formula:

$$M'_{1-a}(Al,Ga)_b(Si,Ge)_cO_{1.5b+1+3c/2}:Eu_x,R_y$$

wherein

M' represents one or more elements selected from the group consisting of Ca, Sr, Ba, and Mg;

R represents one or more elements selected from the group consisting of La, Ce, Pr, Nd, Sm, Gd, Tb, Dy, Ho, Er, Tm, Yb, Lu, Bi, Sn, and Sb; and $0\leq a\leq 1$, $0\leq b\leq 10$, $0\leq c\leq 8$, $0\leq x\leq 0.5$, and $0\leq y\leq 0.5$.

Further, luminous bodies provided by combining the above luminous bodies, for example, $(Ba_{0.9648}Sr_{0.01}Eu_{0.025}Dy_{0.0002})_2(Si_{0.98}Ge_{0.02})_3O_{8.0006}$, $(Ba_{0.9696}Sr_{0.015}Ca_{0.005}Eu_{0.01}Pr_{0.0004})_3(Si_{0.99}Ge_{0.01})O_{5.0018}$, $(Ba_{0.965}Sr_{0.02}Zn_{0.005}Eu_{0.01})(Si_{0.97}Ge_{0.03})_2(Al_{0.002}Dy_{0.00003})O_{5.003045}$, $(Ba_{0.905}Sr_{0.07}Zn_{0.005}Mg_{0.005}Eu_{0.015})_2Si(Al_{0.0001}Dy_{0.0002})O_{4.00045}$, $(Ba_{0.915}Sr_{0.005}Zn_{0.005}Eu_{0.075})_3Mg_{0.99}Mn_{0.01}(Si_{0.998}Ge_{0.002})_2(Ga_{0.0001}Dy_{0.0001})O_{8.0003}$, $(Ba_{0.92}Sr_{0.04}Zn_{0.01}Ca_{0.01}Eu_{0.02})_2Mg(Si_{0.9}Ge_{0.1})_2$
$(Ga_{0.0001}Dy_{0.0002})O_{7.00045}$,
$(Ba_{0.8}K_{0.05}Dy_{0.05}Eu_{0.01})Mg_2Al_{16}O_{27}$,
$(Ba_{0.15}Sr_{0.8}Eu_{0.05})_4Al_{12.5}Ga_{1.49996}$
$Dy_{0.00004}Si_{0.005}O_{25.0075}$, and
$(Ba_{0.47}Sr_{0.5}Eu_{0.03})Al_{1.5997}Ga_{0.4}Dy_{0.0003}Si_{0.004}O_{4.006}$
may be used in layers which produce lights ranging from colored lights to white light in LEDs or compact energy saving lamps.

In order to enhance light emission to the outside of the LED element 6, a light reflective layer may be provided on MQW 64 in its sapphire substrate 61 side. Specifically, an Al layer may be provided as the light reflective layer on the sapphire substrate 61.

Figure 6:
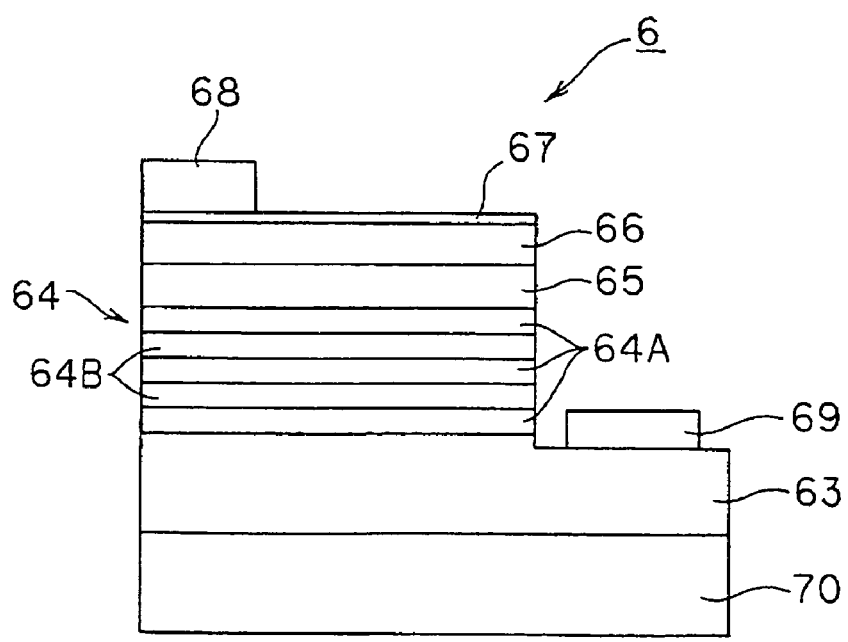
FIG. 6 is a diagram showing another layer construction of the LED element in the first embodiment.

FIG. 6 is a diagram showing another embodiment of the layer construction of the LED element 6. This LED element 6 is the same as the LED element 6 shown in FIG. 5, except that a GaN substrate 70 is used as the substrate and the provision of the AlN buffer layer is omitted. An LED element 6 formed by performing crystal growth of a GaN base semiconductor layer on the GaN substrate 70 may also be used. Further, an LED element 6 using a substrate formed of a material such as Si, SiC, or AlGaN may be used as a light source.

Second Embodiment

FIG. 7 shows a light emitting device in the second embodiment of the invention, wherein (a) is a longitudinal sectional view and (b) is a partially enlarged view of an LED element. Parts corresponding to the respective parts in the first embodiment are identified with the same reference numerals.

Figure 7A:
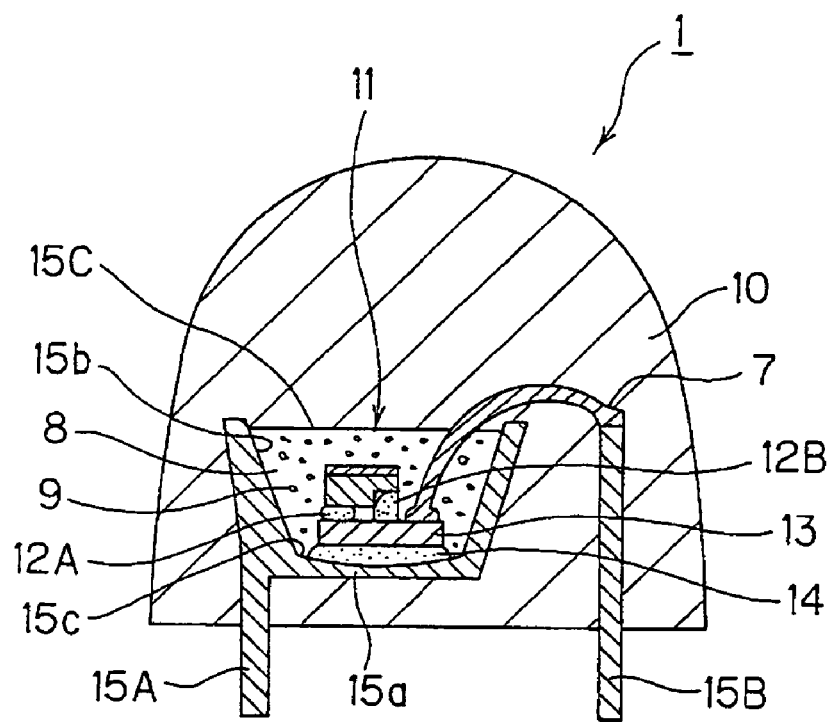
FIG. 7 is a diagram showing a light emitting device in a second embodiment, wherein (a) is a longitudinal sectional view and (b) is a partially enlarged view of an LED element.

In this light emitting device 1, a flip chip-type LED element 11 is used as the light source. As shown in FIG. 7(a), the light emitting device 1 includes an LED element 11. A submount part 13 formed of Si is electrically connected through Au bumps 12A and 12B to the LED element 11. An Ag paste 14 as an electrically conductive adhesive electrically connects the submount part 13 to a lead 15A in its cup part 15a. A lead 15B is electrically connected to the submount part 13 through a wire. An element receiving part 15C is provided in the lead 15A. An inclined light reflective surface 15b is provided within the element receiving part 15C.

Figure 7B:
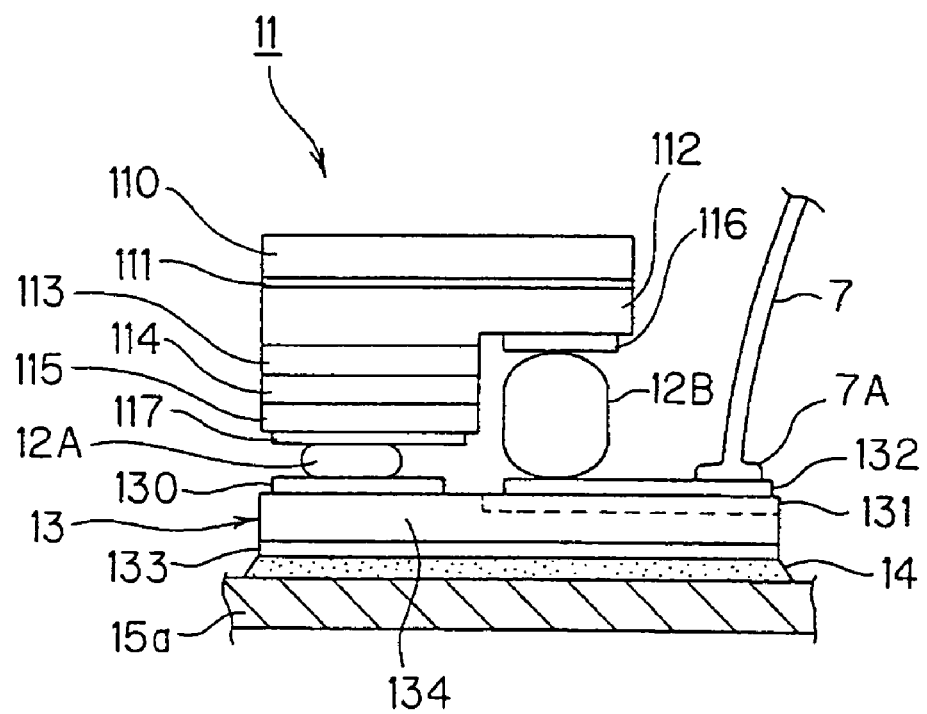

As shown in FIG. 7(b), the LED element 11 includes a light transparent sapphire substrate 110. On the substrate 110 are provided, in the following order, an AlN buffer layer 111, an n-type GaN cladding layer 112, MQW 113 comprising three InGaN well layers alternating with two GaN barrier layers, a p-type GaN cladding layer 114, and a p-type GaN contact layer 115. The LED element 11 further includes an n-side electrode 116 which is formed by removing a part of the p-type GaN contact layer 115, the p-type GaN cladding layer 114, MQW 113, and the n-type GaN cladding layer 112 by etching to expose the n-type GaN cladding layer 112 and forming the n-side electrode 116 on the exposed n-type GaN cladding layer 112. A p-side electrode 117 is provided on the p-type GaN contact layer 115. The LED element 11 is fixed to the submount part 13 so that the substrate side is disposed on the opening side of the cup part 15a.

As shown in FIG. 7(b), the submount part 13 includes an n-type semiconductor layer 134. An n-side electrode 130 is provided on the surface of the n-type semiconductor layer 134. A p-type semiconductor layer 131 is provided on a part of the n-type semiconductor layer 134. A p-side electrode 132 i's provided on the p-type semiconductor layer 131. An n-side electrode 133 is provided on the n-type semiconductor layer 134 in its bottom side, that is, in its side where the n-type semiconductor layer 134 is bonded to the cup part 15a. The n-side electrode 130 is connected to the p-side electrode 117 in the LED element 11 through the Au bump 12A. Further, the p-side electrode 132 is connected through the Au bump 12B to the n-side electrode 116 in the LED element 11, and the wire 7 is connected to the p-side electrode 132.

The sealing resin 8 has been mixed with the luminous body 9 explained in connection with the first embodiment and has been potted into the cup part 15a so as to cover the LED element 11 and the submount part 13 for sealing.

In fixing the LED element 11 to a position within the cup part 15a, an Ag paste 14 is first coated onto the cup part 15a in its bottom part 15c. The submount part 13 is then fixed to the position within the cup part 15a by the Ag paste 14. Next, the LED element 11 is mounted through the Au bumps 12A and 12B. The LED element 11 is bonded to the submount part 13 by ultrasonic bonding. The p-side electrode 132 is then electrically connected to the lead 15B through the wire. The sealing resin 8 is then potted in the cup part 15a to cover the LED element 11 and the submount 13 for sealing.

The sealing resin 10 is molded into a shell shape to seal the lead 15A with the sealed cup part 15a and the lead 15B.

The light emitting device 1 in the second embodiment is advantageous in that, in addition to the favorable effects of the first embodiment, an additional effect, that is, the effect of improving light takeout efficiency, can be attained by virtue of the construction in which light based on light emission in MQW 113 can be emitted from the sapphire substrate side. Further, the function of protection against static electricity can be imparted to the submount part 13. In this case, breaking of the LED element 11 by static electricity can be prevented.

Third Embodiment

Figure 8:
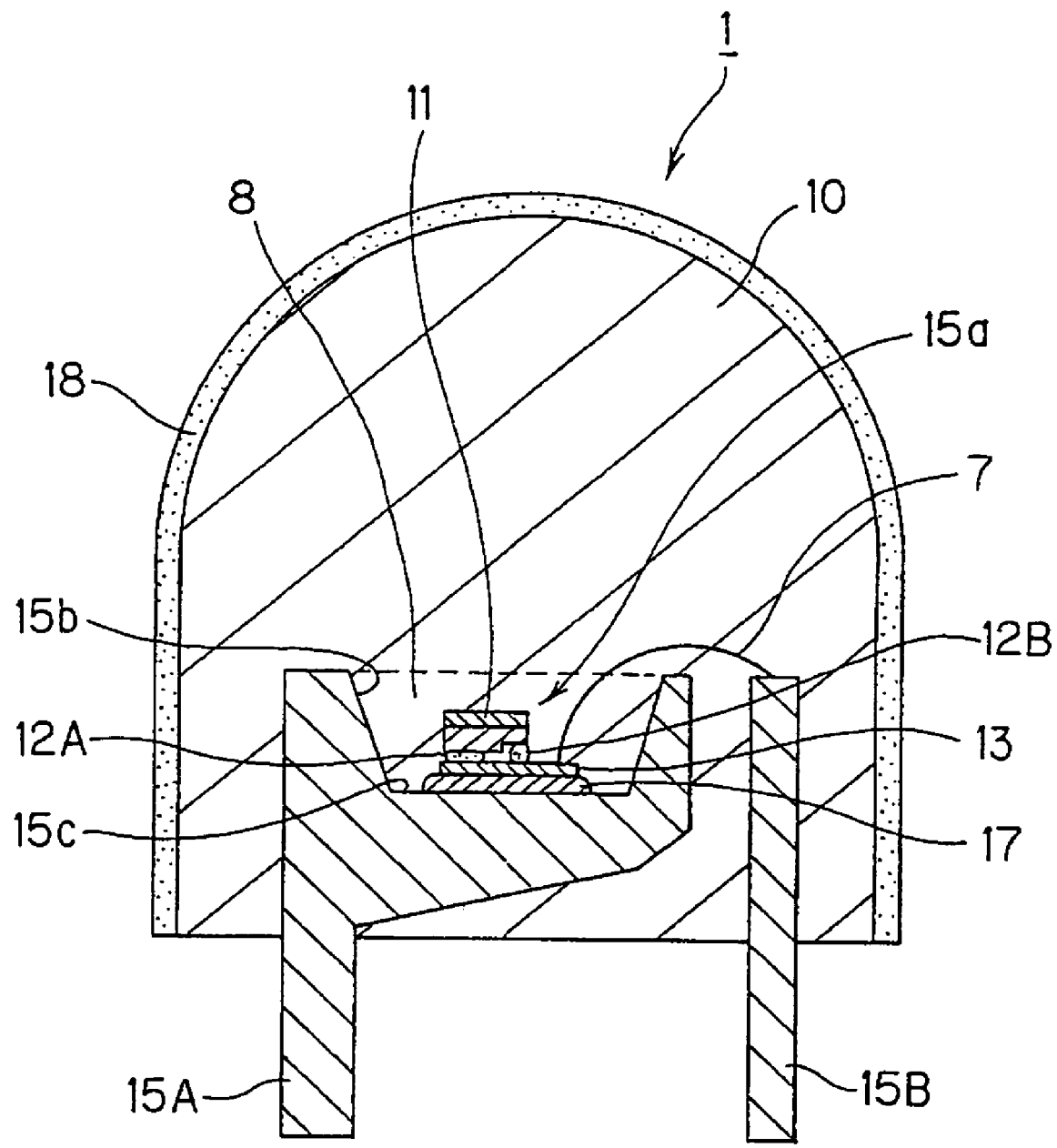
FIG. 8 is a cross-sectional view of a light emitting device in a third embodiment.

FIG. 8 is a cross-sectional view showing a light emitting device in the third embodiment of the invention.

The construction of this light emitting device 1 is such that a cap-shaped luminous body layer 18 formed of a resin material such as an epoxy resin containing the luminous body 9 explained above in connection with the first and second embodiments is provided on the surface of the shell-shaped sealing resin 10, and the luminous body 9 has been omitted from the sealing resin 8 for sealing the cup part 15a.

The light emitting device 1 in the third embodiment is advantageous in that, in addition to the favorable effects of the first and second embodiments, an additional effect can be attained. Specifically, since the luminous body 9 is not deposited around the LED element 11, a lowering in efficiency of emission to the outside of the light emitting device caused by the absorption of light in the deposited phosphor can be prevented. By virtue of this effect, light efficiently led to the surface of the sealing resin 10 can be subjected to wavelength conversion in the luminous body layer 18, followed by emission to the outside to the light emitting device. Thus, a high-brightness wavelength conversion-type light emitting device 1 can be provided.

Fourth Embodiment

Figure 9:
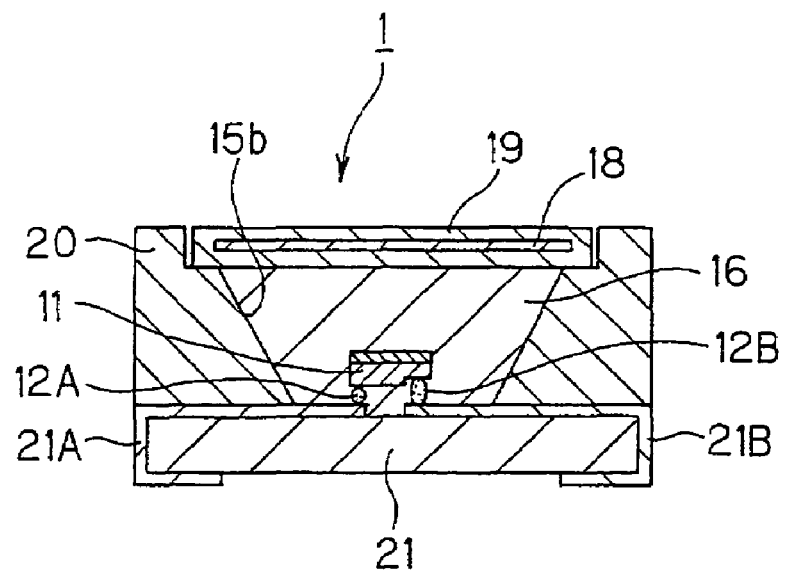
FIG. 9 is a cross-sectional view of a light emitting device in a fourth embodiment.

FIG. 9 is a cross-sectional view showing a light emitting device in the fourth embodiment of the invention. In FIG. 9, parts corresponding to the respective parts in the first to third embodiments are identified with the same reference numerals.

This light emitting device 1 is a surface mounting-type wavelength conversion-type light emitting device 1. The light emitting device 1 includes an LED element 11, a wavelength converting part 19 including a luminous body layer 18 excitable based on light emitted from the LED element 11, a body 20 formed of a resin material such as an acrylic resin, and a ceramic substrate 21 for mounting thereon the LED element 11.

Wavelength converting part 19 is formed by interposing a luminous body layer 18 formed of the luminous body 9 explained above in connection with the first to third embodiments between two glass sheets formed of low melting glass and heating the assembly for integration. Specifically, the luminous body 9 is screen printed on one side of the first glass sheet, and the printed first glass sheet is heat treated at 150° C. to remove the binder component to form a thinned film. The second glass sheet is disposed so that the thinned luminous body layer 18 is interposed between the first and second glass sheets, followed by heat treatment to integrate the first and second glass sheets.

The body 20 has a light reflective surface 15b in its inner part. The light reflective surface 15b reflects light emitted from the LED element 11 toward the wavelength converting part 19. The light emitting surface and the surface of the wavelength converting part 19 constitute an identical plane. A space surrounded by the light reflective surface 15b is filled with a silicone resin 16.

The ceramic substrate 21 has on its surface wiring layers 21A and 21B in a copper foil pattern for joining the LED element 11 to the ceramic substrate 21 through the Au bumps 12A and 12B. The wiring layers 21A and 21B are provided through the side face of the ceramic substrate 21 toward the backside, of the ceramic substrate 21, which is a surface for joining to an external circuit.

The light emitting device 1 in the fourth embodiment of the invention is advantageous in that, in addition to the favorable effects of the first to third embodiments, an additional effect can be attained. Specifically, since the thin-film luminous body layer 18 formed of the luminous body 9 is sealed with glass, the water resistance and moisture absorption resistance of the phosphor layer 18 can be improved. Thus, a light emitting device 1 which exhibits good wavelength conversion for a long period of time can be provided.

Further, the luminous body layer 18 is formed in a thin film form based on screen printing and heat treatment. Therefore, light absorption loss caused by the luminous body layer 18 can be reduced, and, thus, a high-brightness wavelength conversion-type light emitting device 1 can be realized.

Furthermore, by virtue of a thickness reduction in the luminous body layer 18, the amount of the luminous body 9 used can be reduced. Therefore, a cost reduction in the light emitting device 1 can be realized.

Fifth Embodiment

Figure 10:
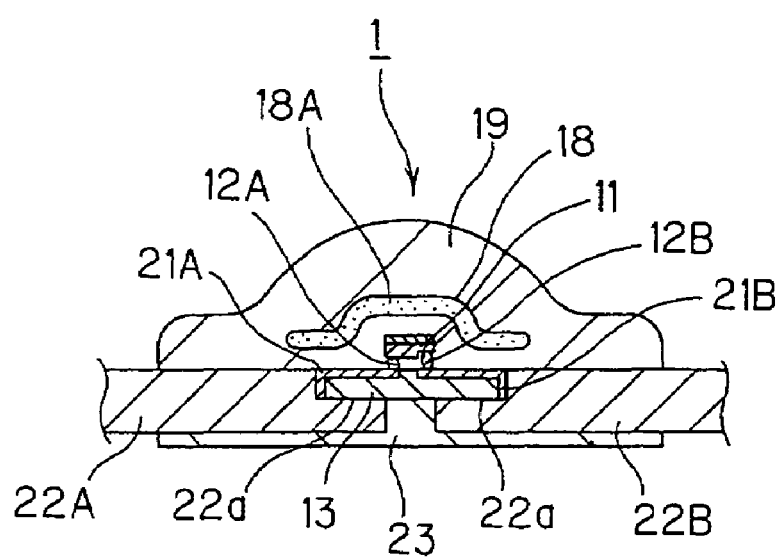
FIG. 10 is a cross-sectional view of a light emitting device in a fifth embodiment.

FIG. 10 is a cross-sectional view showing a light emitting device in the fifth embodiment of the invention. In FIG. 10, parts corresponding to the respective parts in the first to fourth embodiments are identified with the same reference numerals.

This light emitting device 1 includes a flip chip-type (0.3×0.3 mm) LED element 11. The LED element 11 is mounted on a submount part 13 of AlN. Lead frames 22A and 22B are joined to the submount part 13. A wavelength converting part 19 formed of low melting glass is provided for sealing the LED element 11 and the submount part 13 and for performing wavelength conversion of light emitted from the LED element 11. The submount part 13 and the lead frames 22A and 22B, together with the wavelength converting part 19, are integrally sealed by a glass sealing part 23 formed of low melting glass. The wavelength converting part 19 has an optical shape which can regulate the distribution of light emitted from the LED element 11, that is, is formed in a dome form, and, further, comprises a luminous body layer 18 disposed apart by a predetermined distance from the LED element 11.

Wiring layers 21A and 21B formed of a copper foil are provided on the surface of the submount part 13. The wiring layers 21A and 21B are electrically connected to the lead frames 22A and 22B by fitting into stepped parts 22a and 22b provided in the lead frames 22A and 22B.

In the wavelength converting part 19, the optical shape is formed by interposing the luminous body layer 18 between the first and second glass sheets explained above in connection with the fourth embodiment and hot pressing the assembly. Further, the lead frames 22A and 22B are integrally sealed by heat treatment of a third glass sheet for constituting the glass sealing part 23 simultaneously with the hot pressing. The luminous body layer 18 is disposed while providing a spacing, corresponding to the thickness of the glass sheet upon deformation based on the heat treatment of the glass, between the luminous body layer 18 and the LED element 11.

The light emitting device 1 in the fifth embodiment of the invention is advantageous in that, in addition to the favorable effects of the first to fourth embodiments, an additional effect can be attained. Specifically, since the wavelength converting part 19 has an optical shape, light produced by mixing light emitted from the LED element 11 with light subjected to wavelength conversion in the luminous body layer 18 can be emitted to a desired area.

Further, sealing of the LED element 11 with glass can improve water resistance and moisture absorption resistance. Thus, a high-brightness wavelength conversion-type light emitting device 1, which is stable even under severe environmental conditions such as high-humidity conditions for a long period, can be realized.

Sixth Embodiment

Figure 11:
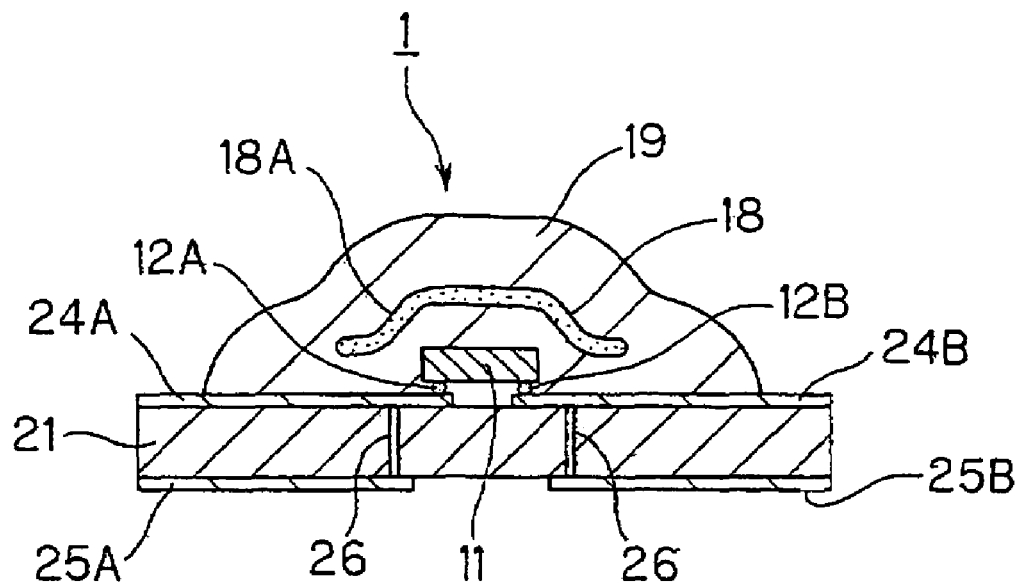
FIG. 11 is a cross-sectional view of a light emitting device in a sixth embodiment.

FIG. 11 is a cross-sectional view showing a light emitting device in the sixth embodiment of the invention. In FIG. 11, parts corresponding to the respective parts in the first to fifth embodiments are identified with the same reference numerals.

In this light emitting device 1, instead of the lead frames 22A and 22B in the fifth embodiment, a ceramic substrate 21 having on its both sides wiring layers 24A, 24B, 25A, and 25B formed of a copper foil is used, and the wiring layer 24A is electrically connected to the wiring layer 25A through a through-hole 26 while the wiring layer 24B is electrically connected to the wiring layer 25B through a through-hole 26. A flip chip-type (1×1 mm) LED element 11 is electrically connected to the wiring layers 24A, 24B respectively through Au bumps 12A and 12B.

The wiring layers 24A and 24B are formed so as to have a larger area than the area of bonding of the glass material constituting the wavelength converting part 19.

The light emitting device 1 in the sixth embodiment of the invention is advantageous in that, in addition to the favorable effects of the first to fifth embodiments, an additional effect can be attained. Specifically, since the wavelength converting part 19 is bonded to the wiring layers 24A and 24B formed of a copper foil provided on the surface of the ceramic substrate 21, excellent adhesion between the wavelength converting part 19 and the wiring layers 24A and 24B can be achieved based on good adhesion between the glass material and the copper foil. By virtue of this, separation of the wavelength converting part 19 and absorption of moisture in the interior of the light emitting device 1 can be firmly prevented. Thus, a highly reliable wavelength conversion-type light emitting device 1 can be realized.

Further, since the ceramic substrate 21 is used, a group of light emitting devices which have been formed together on a substrate material as a base can easily be taken off by cutting such as dicing or scribing. Thus, a wavelength conversion-type light emitting device 1 can be manufactured with high productivity.

Seventh Embodiment

Figure 12:
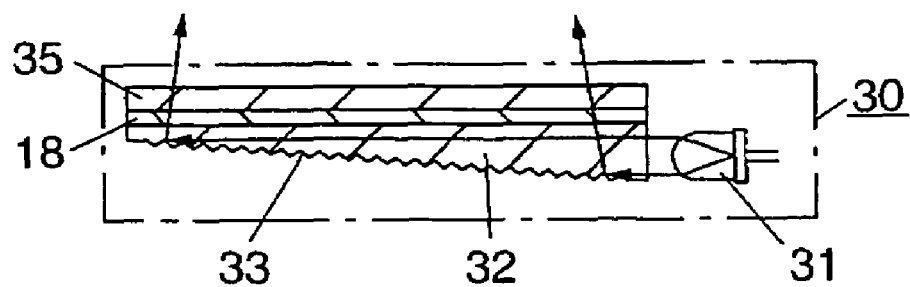
FIG. 12 is a cross-sectional view of a liquid crystal backlight device as an optical device in a seventh embodiment.

FIG. 12 is a cross-sectional view showing a liquid crystal backlight device as an optical device in the seventh embodiment of the invention. In FIG. 12, parts corresponding to the respective parts in the first to sixth embodiments are identified with the same reference numerals.

This liquid crystal backlight device 30 includes an LED lamp 31 as a light source, and a light guide body 32 for guiding light emitted from the LED lamp. A luminous body layer 18 for performing wavelength conversion of light emitted from the LED lamp 31 is provided on a surface of the light guide body 32. A liquid crystal panel 35 is provided for permitting the transmission of light from the back surface based on the wavelength converted light.

The LED lamp 31 functions to collect, in a shell-shaped resin sealing part, blue light with wavelength 460 nm based on light emission in an LED element comprising a GaN based semiconductor layer and to emit the collected light to a predetermined radiation area.

The light guide body 32 has a reflecting surface 32A for reflecting light supplied from the LED lamp 31 in a right-angle direction, a bottom surface 32B, and an inclined surface 32C to which the light, which has been reflected from the reflecting surface 32A and guided through the light guide body 32, is incident. A light reflective layer 33 is provided on the bottom surface 32B. Further, a luminous body layer 18 formed of a luminous body comprising a conventional activator and, in addition, at least one coactivator selected from La, Ce, Pr, Nd, Sm, Gd, Tb, Dy, Ho, Er, Tm, Yb, Lu, Bi, Sn, Sb, and analogues thereof is provided in a thin film form on the inclined surface 32C.

The liquid crystal panel 35 comprises, for example, a TFT (thin film transistor) substrate, a liquid crystal layer, and a color filter substrate stacked on top of one another and is transparent to light for permitting light emitted from the light guide body 32 to be transmitted therethrough.

In this liquid crystal backlight device 30, light emitted from the LED lamp 31 is guided to the inclined surface 32C through the light guide body 32, and the light emitted from the LED lamp 31 is subjected to wavelength conversion in the luminous body layer 18 provided on the inclined surface 32C to produce white light, which passes through the liquid crystal panel 35 for illumination.

The liquid crystal backlight device 30 in the seventh embodiment of the invention is advantageous in that, in addition to the favorable effects explained above in connection with the first to sixth embodiments, an additional effect can be attained. Specifically, light guided through the light guide body 32 is subjected to wavelength conversion in the luminous body layer 18 provided on the backside of the liquid crystal backlight device 30 before emission to the outside of the backlight device. According to this construction, good brightness can be provided using blue light as a light source. Further, a transmission illumination structure with a prolonged fluorescence lifetime can be realized, and the backlight device can impart novel visuality as an illuminator for cellular phones (portable telephones) or equipment having a liquid crystal display part.

Further, the fluorescence lifetime of the luminous body layer 18 is so long that power saving can be realized based on a combination of the luminous body layer 18 with the regulation of light emission in the LED lamp 31 without sacrificing the light quality and the serviceable time of equipment using a power supply such as a battery can be prolonged.

In the construction of the seventh embodiment, light emitted from the LED lamp 31 is reflected from the reflecting surface 32A, and the reflected light is then guided through the light guide body 32. Alternatively, a construction not provided with the reflecting surface 32A can be adopted. For example, instead of the reflecting surface 32A, a light incidence end face perpendicular to the bottom surface 32B is formed so that the direction of emitted light incident to the light guide body 32 is identical to the light guide direction.

Further, in addition to an LED lamp capable of emitting blue light, an LED lamp capable of emitting ultraviolet light can be used as the LED lamp 31.

INDUSTRIAL APPLICABILITY

As described above, according to the invention, since, in addition to the conventional activator, at least one coactivator selected from La, Ce, Pr, Nd, Sm, Gd, Tb, Dy, Ho, Er, Tm, Yb, Lu, Bi, Sn, Sb and analogues thereof is used, the thermostability of the luminous body can be improved. Therefore, a shift in light emission energy distribution is less likely to take place, and a change in a light color can be suppressed. Further, the fluorescence lifetime can be prolonged from a few microsecond order to a few seconds or a few minutes.

Furthermore, the use of the luminous body with improved thermostability and fluorescence lifetime properties can provide optical devices having excellent properties such as high light quality, good power saving, and high brightness.

The invention claimed is:

1. A luminous body with a prolonged fluorescence lifetime, wherein the luminous body comprises silicate-germanate and is doped with europium to improve its thermostability, wherein the luminous body comprises an additional dopant and corresponds to the empirical formula:

$$M'_a M''_b (Si_{1-z}Ge_z)_c (Al,Ga,In)_d (Sb,V,Nb,Ta)_e O_{(a+b+2c+3d/2+5e/2-n/2)} X_n : Eu_x, R_y$$

wherein:
M' represents one or more elements selected from the group consisting of calcium (Ca), strontium (Sr), barium (Ba), and zinc (Zn);
M" represents one or more elements selected from the group consisting of magnesium (Mg), cadmium (Cd), manganese (Mn), and beryllium (Be);

R represents one or more elements selected from the group consisting of La, Ce, Pr, Nd, Sm, Gd, Tb, Dy, Ho, Er, Tm, Yb, Lu, Bi, Sn, and Sb;

X represents an ion selected from the group consisting of fluorine (F), chlorine (Cl), and bromine (Br) to balance the charge;

and $0.5 \leq a \leq 8$,
$0 \leq b \leq 5$,
$0 < c \leq 10$,
$0 \leq d \leq 2$,
$0 \leq e \leq 2$,
$0 \leq n \leq 4$,
$0 \leq x \leq 0.5$,
$0 \leq y \leq 0.5$, and
$0 < z < 1$.

2. A luminous body with a prolonged fluorescence lifetime, wherein the luminous body comprises aluminate-gallate and is doped with europium to improve its thermostability, wherein the luminous body comprises an additional dopant and corresponds to the empirical formula:

$$M'_4(Al,Ga)_{14}(Si,Ge)_p O_{25+2p}:Eu_x,R_y$$

wherein:

M' represents one or more elements selected from the group consisting of Sr, Ba, Ca, Mg, and Zn;

R represents one or more elements selected from the group consisting of La, Ce, Pr, Nd, Sm, Gd, Tb, Dy, Ho, Er, Tm, Yb, Lu, Bi, Sn, and Sb;

and $0 < p \leq 1$, or the empirical formula $$M''(Al,Ga)_2(Si,Ge)_p O_{4+2p}:Eu_x,R_y$$

wherein:

M'' represents one or more elements selected from the group consisting of Sr, Ba, Ca, Mg, and Zn;

R represents one or more elements selected from the group consisting of La, Ce, Pr, Nd, Sm, Gd, Tb, Dy, Ho, Er, Tm, Yb, Lu, Bi, Sn, and Sb;

and $0 < p \leq 1$,
$0 \leq x \leq 0.5$, and
$0 \leq y \leq 0.5$.

3. The luminous body with a prolonged fluorescence lifetime according to claim 1, wherein the luminous body further comprises aluminate represented by the empirical formula:

$$(M',M'',M''')M''''_2 Al_{16} O_{27}:Eu_x,R_y$$

wherein:

M' represents one or more elements selected from the group consisting of Ba, Sr, and Ca;

M'' represents one or more elements selected from the group consisting of lithium (Li), sodium (Na), potassium (K), and rubidium (Rb);

M''' represents Dy;

M'''' represents Mg or Mn;

R represents one or more elements selected from the group consisting of La, Ce, Pr, Nd, Sm, Gd, Tb, Ho, Er, Tm, Yb, Lu, Bi, Sn, and Sb;

$0 < x \leq 0.5$, and
$0 \leq y \leq 0.5$.

4. A luminous body with a prolonged fluorescence lifetime, wherein the luminous body comprises alkaline earth metal aluminate-gallate and is doped with europium to improve its thermostability, wherein the luminous body comprises an additional dopant and corresponds to the empirical formula:

$$M'_{a-a}(Al,Ga)_b(Si,Ge)_b(Si,Ge)_c O_{1.5b+1+3c/2}:Eu_x,R_y$$

wherein:

M' represents one or more elements selected from the group consisting of ca, Sr, Ba, and Mg;

R represents one or more elements selected from the group consisting of La, Ce, Pr, Nd, Sm, Gd, Tb, Dy, Ho, Er, Tm, Yb, Lu, Bi, Sn, and Sb;

and $0 \leq a \leq 1$,
$0 < b \leq 10$,
$0 \leq c \leq 8$,
$0 \leq x \leq 0.5$, and
$0 \leq y \leq 0.5$.

5. The luminous body with a prolonged fluorescence lifetime according to claim 1, wherein the luminous body comprises a single type or a mixture of two or more types.

6. The luminous body with a prolonged fluorescence lifetime according to claim 1, wherein the luminous body is used as a luminous layer in the preparation of a light-emitting diode (LED).

7. The luminous body with a prolonged fluorescence lifetime according to claim 1, wherein the luminous body is used in a layer which emits light ranging from colored light to white light in a light-emitting diode (LED).

8. The luminous body with a prolonged fluorescence lifetime according to claim 1, wherein the luminous body is used in a light-emitting diode (LED) which, upon switch-off of excitation energy of a luminous layer, causes a color change in emission of a radiation.

9. The luminous body with a prolonged fluorescence lifetime according to claim 1, wherein the luminous body comprises a single type or a mixture of two or more types and is used in the preparation of a luminous layer of a compact energy saving lamp.

10. An optical device comprising a wavelength converting part comprising the luminous body as defined by claim 1.

11. An optical device comprising:

light-emitting diode (LED) element;

a power feeding part for mounting the LED element thereon and feeding power to the LED element;

a light transparent sealing part for sealing the LED element and the power feeding part integrally with each other; and a wavelength converting part for emitting light upon excitation based on light emitted from the LED element, the wavelength converting part comprising the luminous body as defined by claim 1.

12. An optical device comprising:

light-emitting diode (LED) lamp;

a light guiding part for guiding light emitted from the LED lamp; and a wavelength converting part for emitting light upon excitation based on light guided through the light guiding part, the wavelength converting part comprising the luminous body as defined by claim 1.

13. The optical device according to claim 11, wherein the wavelength converting part is included in a light transparent sealing resin for sealing the LED element.

14. The optical device according to claim 11, wherein the luminous body comprises a thin-film luminous body layer that is sealed with a light transparent glass.

15. The optical device according to claim 14, wherein the luminous body layer is planar.

16. The optical device according to claim 11, wherein the wavelength converting part is provided on a surface of a sealing resin comprising an optical shape that radiates light emitted from the LED element in a desired lighting area.

17. The optical device according to claim 10, wherein the wavelength converting part is excited upon exposure to blue light and/or ultraviolet light with wavelengths ranging from 300 nm to 500 nm.

* * * * *